United States Patent
Kinoshita et al.

(10) Patent No.: US 7,411,222 B2
(45) Date of Patent: Aug. 12, 2008

(54) PACKAGE FOR LIGHT EMITTING ELEMENT AND MANUFACTURING METHOD THEREOF

(75) Inventors: Junichi Kinoshita, Ehime-ken (JP);
Tsuneo Nakayama, Ehime-ken (JP);
Takao Mizukami, Kanagawa-ken (JP);
Yuji Wagatsuma, Kanagawa-ken (JP);
Kiyoshi Matsunaga, Ehime-ken (JP);
Naoki Matsuoka, Ehime-ken (JP);
Norihiko Ochi, Ehime-ken (JP)

(73) Assignee: Harison Toshiba Lighting Corporation, Imabari-shi, Ehime (JP)

( * ) Notice: Subject to any disclaimer, the term of this patent is extended or adjusted under 35 U.S.C. 154(b) by 104 days.

(21) Appl. No.: 10/567,560

(22) PCT Filed: Nov. 11, 2004

(86) PCT No.: PCT/JP2004/016734

§ 371 (c)(1),
(2), (4) Date: Feb. 8, 2006

(87) PCT Pub. No.: WO2005/048360

PCT Pub. Date: May 26, 2005

(65) Prior Publication Data

US 2006/0285804 A1    Dec. 21, 2006

(30) Foreign Application Priority Data

Nov. 14, 2003    (JP)    ............................. 2003-384956

(51) Int. Cl.
*H01L 33/00*    (2006.01)
*G02B 6/00*    (2006.01)
(52) U.S. Cl. ............................. 257/98; 385/14; 385/88; 257/82; 257/99; 257/100; 257/431; 257/432

(58) Field of Classification Search .................... 385/14, 385/88–94; 257/98–100, 431–433
See application file for complete search history.

(56) References Cited

U.S. PATENT DOCUMENTS 6,593,598 B2 *    7/2003    Ishinaga ........................ 257/98

(Continued)

FOREIGN PATENT DOCUMENTS

EP    1 235 281 A1    8/2002

(Continued)

OTHER PUBLICATIONS

A communication from the Written Opinion for corresponding International Application No. PCT/JP2004/016734.

(Continued)

*Primary Examiner*—M. R. Connelly-Cushwa
(74) *Attorney, Agent, or Firm*—Banner & Witcoff, Ltd

(57) ABSTRACT

A package for light emitting element including a package main body 1 having a bottom face 7a on which a light emitting element 2 is arranged, and a concave portion 7 which is formed in an inverted truncated cone shape by an inner wall face 7b intersecting with the bottom face 7a with a predetermined angle, and a translucent member 6 filled in the concave portion 7 of the package main body 1, the angle between the inner wall face 7b composing the concave portion 7 and the bottom face 7a is selected within ±15° of the incident critical angle in which a direct light radiated from the light emitting element 2 undergoes total reflection at the interface between the translucent member 6 and air.

22 Claims, 9 Drawing Sheets

U.S. PATENT DOCUMENTS

| | | | |
|---|---|---|---|
| 7,045,828 B2 * | 5/2006 | Shimizu et al. | ............... 257/98 |
| 2002/0134988 A1 | 9/2002 | Ishinaga | |

FOREIGN PATENT DOCUMENTS

| JP | 7-199829 A | 8/1995 |
|---|---|---|
| JP | 11-8415 A | 1/1999 |
| JP | 11-284234 A | 10/1999 |
| JP | 2001-177155 A | 6/2001 |
| JP | 2003-158302 A | 5/2003 |
| JP | 2003-187624 A | 7/2003 |

OTHER PUBLICATIONS

Supplemental European Search Report of Application No. EP 04 81 8491 dated Dec. 20, 2007.

* cited by examiner

PACKAGE FOR LIGHT EMITTING ELEMENT AND MANUFACTURING METHOD THEREOF

This application is a national stage application of co-pending PCT application PCT/JP2004/016734 filed Nov. 11, 2004, which was published in Japanese under PCT Article 21(2) on May 26, 2005, which claims priority to Japanese non-provisional patent application ser. no. 2003-384956 filed Nov. 14, 2003. The disclosures of these applications are expressly incorporated herein by reference.

TECHNICAL FIELD

The present invention relates to a package for light emitting element designed so as to radiate outward the light emitted by a light emitting element and manufacturing method thereof.

BACKGROUND TECHNOLOGY OF THE INVENTION

A package for storing semiconductor light emitting element, for example, is shown in Japanese Patent Official Gazette laid open No. 2003-163378. The package is provided with a package 1 made of resin with a concave portion of inclined inner wall 7 on the upper face, as shown in FIG. 8 of the Gazette. On the bottom face of the concave portion of the package 1, a first lead frame 3a and a second lead frame 4a, both are arranged facing to each other, are provided. One electrode of semiconductor light emitting element 2 is mounted on the first lead frame 3a to be connected electrically. Another electrode of the light emitting element 2 is connected with the second lead frame 4a through a wire 5. In the concave portion of the package 1, a translucent sealing resin 6 is filled for sealing.

In such a package, light emitted from the light emitting element 2 is radiated outward through the sealing resin 6.

DISCLOSURE OF THE INVENTION

However, in the above-mentioned package, because the angle between the inner wall and the bottom face at the concave portion is not considered optically at all, the light from the light emitting element was not designed to radiate outward effectively.

The present invention is performed to improve above mentioned problems, it aims to supply a package for light emitting element capable of radiating effectively outward the emitted light of light emitting element and the manufacturing method thereof.

A package for light emitting element according to an embodiment of the present invention includes; a bottom face on which a light emitting element is arranged, a package main body having a concave portion formed as an inverted truncated cone with an inner wall face intersecting with the bottom face by a predetermined angle, and a translucent member filled in the concave portion of the package main body, the angle between the bottom face and the inner wall face composing the concave portion is selected within ±15° range of the incident critical angle by which a total reflection occurs by a direct light radiated from the light emitting element at the interface between the translucent member and air.

And, as to the package of the light emitting element according to the embodiment of the present invention, the main body of the package is composed of resin or ceramic.

Further, as to the package of the light emitting element according to the embodiment of the present invention, the main body of the package is composed of white resin or white ceramic.

Further, as to the package of the light emitting element according to the embodiment of the present invention, the white resin is composed of polyphthalamide resin or silicone resin.

And, as to the package of the light emitting element according to the embodiment of the present invention, the reflectivity of the inner wall of the convex portion is 60% or higher.

Further, as to the package of the light emitting element according to the embodiment of the present invention, a lead frame on which the light emitting element is mounted is provided on the bottom face of the concave portion, apart of the lead frame is exposed from the recess portion formed on the inner wall face of the concave portion.

In the package for light emitting element composed in this way, if the light emitted from the light emitting element radiated in the inner wall face composing the recess portion, all of the reflected light can be taken out outward the package, the utilization efficiency of the light can be drastically improved.

And, a space for wire bonding the upper electrode of the light emitting element with the lead frame can be secured by the recess portion formed on one part of the inner wall face.

A package for light emitting element according to another embodiment of the present invention includes; a package main body around a central concave portion on the bottom of which a light emitting element is formed, a plurality of peripheral concave portions on the bottom of which light emitting elements are not arranged, are formed, and a translucent member filled in the central concave portion and a plurality of peripheral concave portions in common which are formed on the package main body, the angles between the inner wall face of the plurality of peripheral concave portions and the bottom face are nearly equal to the corresponding angle of the central concave portion.

According to the present embodiment, light radiated from the light emitting element arranged in the central concave portion is total reflected at the interface of the translucent member and air to return to the peripheral concave portion and is reflected by the inner wall face of the peripheral concave portion and the bottom face to radiate outward the package main body. By the above mentioned process, light emitted by the light emitting element can be radiated outward effectively.

And, in a package for light emitting element according to the further different embodiment of the present invention, the plurality of peripheral concave portion are arranged in a manner so as to form a plurality of concentric circles around the central concave portion.

Further, a package for light emitting element according to the further different embodiment of the present invention includes; a package main body around the central concave portion a light emitting element is arranged on the bottom of which a plurality of concentric circle shaped reflection grooves are formed, a translucent member filled in the central concave portion formed on the package main body and in the plurality of reflecting grooves, the central concave portion is formed by the bottom face on which the light emitting element is arranged and inner wall face intersecting the bottom face in an inverted truncated cone shape, the angle between the inner wall face and the bottom face is selected within ±15° range of the incident critical angle by which a total reflection occurs by a direct light radiated from the light emitting element at the interface between the translucent member and air, the angles between the inner wall face of the plurality of peripheral concave portions and the bottom face are nearly equal to the corresponding angle of the central concave portion.

A manufacturing method of a package of a light emitting element according to an embodiment of the present invention includes; preparing a package main body having a bottom face on which a light emitting element is arranged and having a concave portion formed in an inverted truncated cone shape, and preparing a translucent member filled in the concave portion of the package main body, and selecting the angle between the inner wall face and the bottom face forming the concave portion as within ±15° range of the incident critical angle by which a total reflection occurs by a direct light radiated from the light emitting element at the interface between the translucent member and air.

DETAILED DESCRIPTION OF THE INVENTION

Hereinafter, embodiments of the present invention will be explained in detail referring to the figures.

Figure 1:
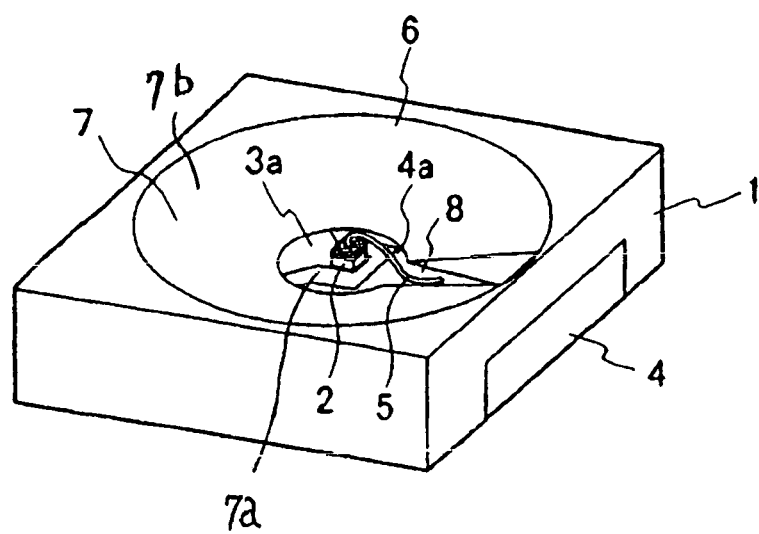
FIG. 1 is a perspective view showing a construction of a package of a light emitting element according to an embodiment of the present invention.
Figure 2:
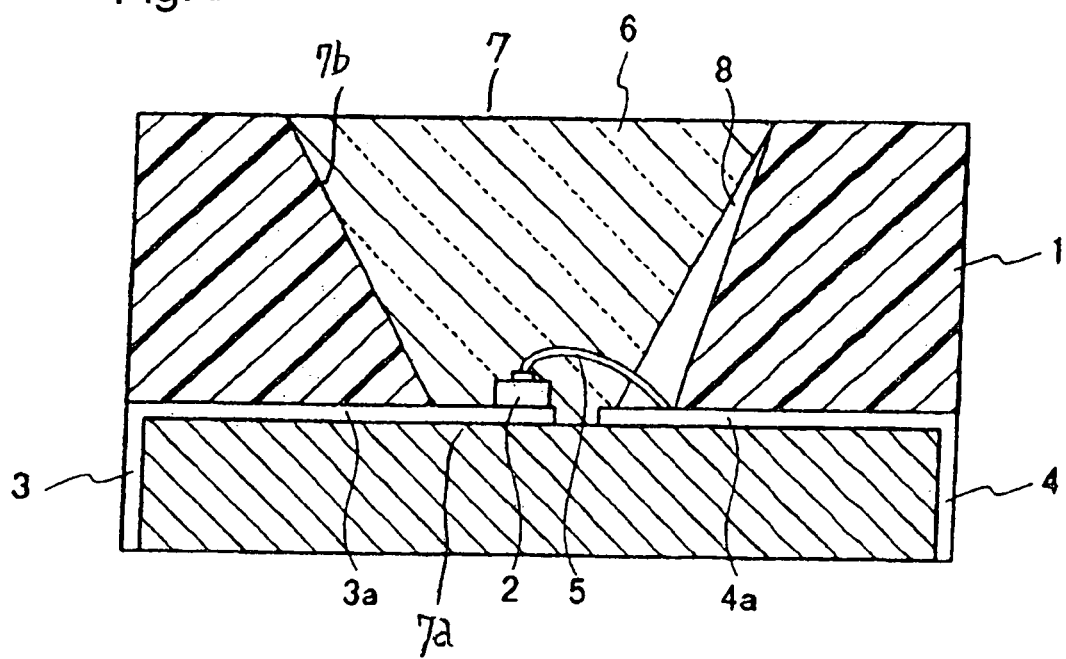
FIG. 2 is a cross section showing a construction of the package shown in FIG. 1.

FIG. 1 is a perspective view of a package of a light emitting element which is an embodiment of the present invention, FIG. 2 is a cross section. The package shown in the figure is the one generally called SMD (surface mount device) type. The package is provided with, for example, a package main body 1 made of white polyphtalamide (PPA) resin, and a concave portion 7 which has an opening on upper face central portion on the package main body 1. The concave portion 7 is composed of nearly horizontal bottom face 7a, and an inner wall face 7b which intersects with the bottom face 7b by a slanted direction, is formed as nearly inverted truncated cone shape. The color and roughness of the surface of these bottom face 7a and inner wall face 7b are processed so as to reflect the incident light to these faces by nearly perfect diffuse reflection condition. On the bottom face 7a of the concave portion 7, a first lead frame 3 and a second lead frame 4 made of metal are arranged nearly horizontally facing to each other, major parts of the first lead frame 3 and the second lead frame 4 are embedded in the package main body 1 made of resin, end portions facing to each other are exposed on the bottom face 7a of the concave portion. On the exposed end of the first lead frame 3 an electrode portion 3a, on the exposed end of the second lead frame 4 an electrode portion 4a, are formed respectively. On the electrode portion 3a of the first lead frame 3, an under surface electrode of a light emitting element 2, for example, an LED (Light Emitting Diode), is connected using an electricity conducting material, an upper surface electrode of the light emitting element 2 is connected with an electrode portion 4a of the second lead frame 4 through a wire 5. In this situation, a translucent member 6 such as translucent epoxy resin is filled in the concave portion 7. Interface of the translucent member 6 and air (hereinafter, described simply as "interface") is nearly parallel to the bottom face 7a of the concave portion 7. The wire 5 is for example, made of gold.

Next, angle θ1 between the bottom face 7a and the inner wall face 7b of the concave portion 7 is nearly matched with incident critical angle θ2 in which direct light radiated from the light emitting element 2 undergoes total reflection at the interface.

For example, when an epoxy resin is used as the translucent member 6, the refractive index n is round 1.5, higher than the refractive index 1 of air. In this case, incident critical angle θ2 at the interface of epoxy resin and air is 49°. Therefore, light which enters to the interface with incident angle higher than 49° from the light emitting element 2 is reflected and is radiated outward, however, light which enters with incident angle lower than 49° undergoes total reflection to go back inside the concave portion 7. That is, as a direct light from the light emitting element 2, only the light inside a circular cone (hereinafter called as a radiation circular cone) 80 can be taken outside, the circular cone having apex at the position of light emitting element 2, angle between side face and interface is 49°. The direct light inside the radiation circular cone 80 is radiated to air layer side without being attenuated by the reflection at the inner wall face of the concave portion 7 or at the interface.

On the other hand, as lights can be taken out, there is a light reflected at the inner wall face 7b of the concave portion 3, beside the direct light from the light emitting element 2. It is important how to take out the light reflected by the inner wall face 7b, when radiating outside the light from the light emitting element 2 effectively.

Figure 4:
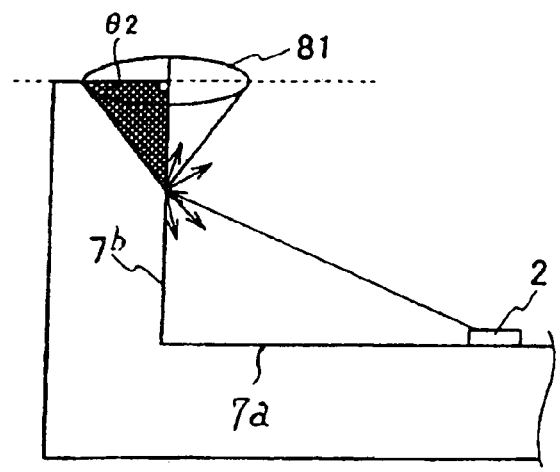
FIG. 4 is a figure for explaining a reflected light which can be taken outward when the angle between the inner wall face and the bottom face is a right angle in the package shown in FIG. 1

In the present invention, light radiated on the inner wall face 7b undergoes diffuse reflection, so it is reflected to all directions. Let the inner wall face 7b is perpendicular to the bottom face 7a of the concave portion 7, as shown in FIG. 4, half light out of the light inside the radiation circular cone 81 having apex at the reflection position of light in the inner wall face 7b, the bottom face 7a as interface, angle between side face and interface is 49°, is reflected inside the convex portion 7 by the inner wall face 7b, so half of the light cannot be taken outside.

Figure 5:
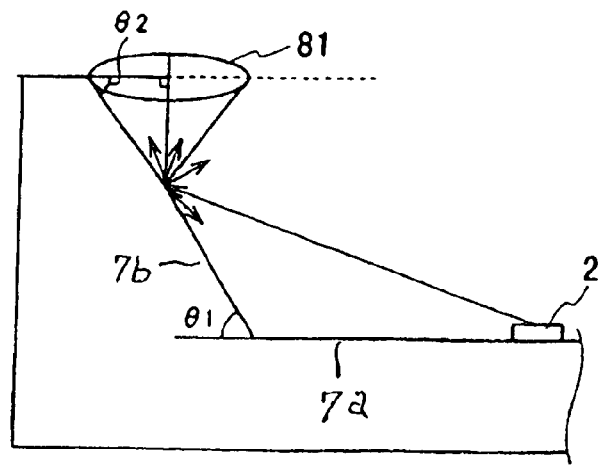
FIG. 5 is a figure for explaining a reflected light which can be taken outward when the angle between the inner wall face and the bottom face is matched with the incident critical angle to make the light from light emitting element total reflection at the interface of translucent material and air in the package shown in FIG. 1.

Therefore, in the present embodiment, by matching the angle θ1 between the inner wall face 7b and the bottom face 7a of the concave portion 7 with the incident critical angle θ2, whole the radiation circular cone 81 is entirely secured in the translucent member 6 to take out the whole light inside the radiation circular cone 81, as shown in FIG. 5.

Figure 6:
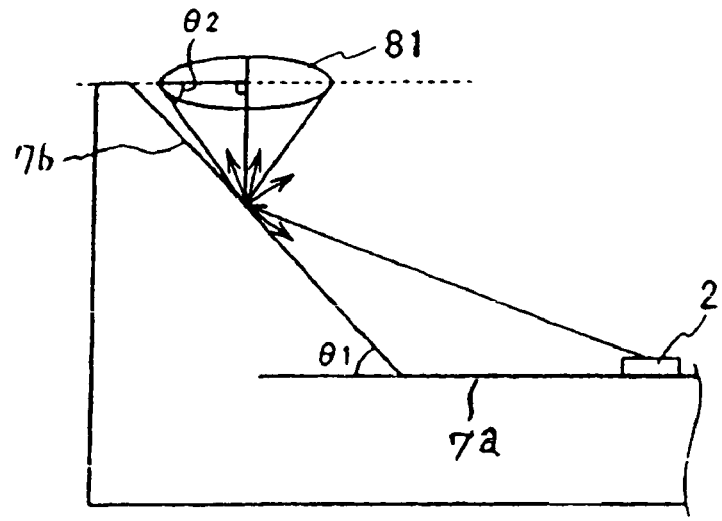
FIG. 6 is a figure for explaining a reflected light which can be taken outward when the angle between the inner wall face and the bottom face is made smaller than the incident critical angle to make the light from light emitting element total reflection at the interface of translucent material and air in the package shown in FIG. 1.

Or else, angle θ1 of the inner wall face 7b is made a little bit lower than the incident critical angle θ2, as shown in FIG. 6. Also in this case, because the radiation circular cone 81 is entirely secured in the translucent member 6, whole the light in the radiation circular cone 81 can be taken outside.

And, when angle θ1 of the inner wall face 7b is extremely higher than the incident critical angle θ2 or extremely lower, the light reflected by the inner wall face 7b often cannot transmit the interface and the light goes back again to the translucent member 6 by reflection. Such light repeats reflection by the inner wall face 7b or bottom face 7a in the translucent member 6 to attenuate because of long light path, so the outward available amount of light decreases. Therefore, there exists an appropriate range as to the angle θ1 of the inner wall face 7b.

Figure 7:
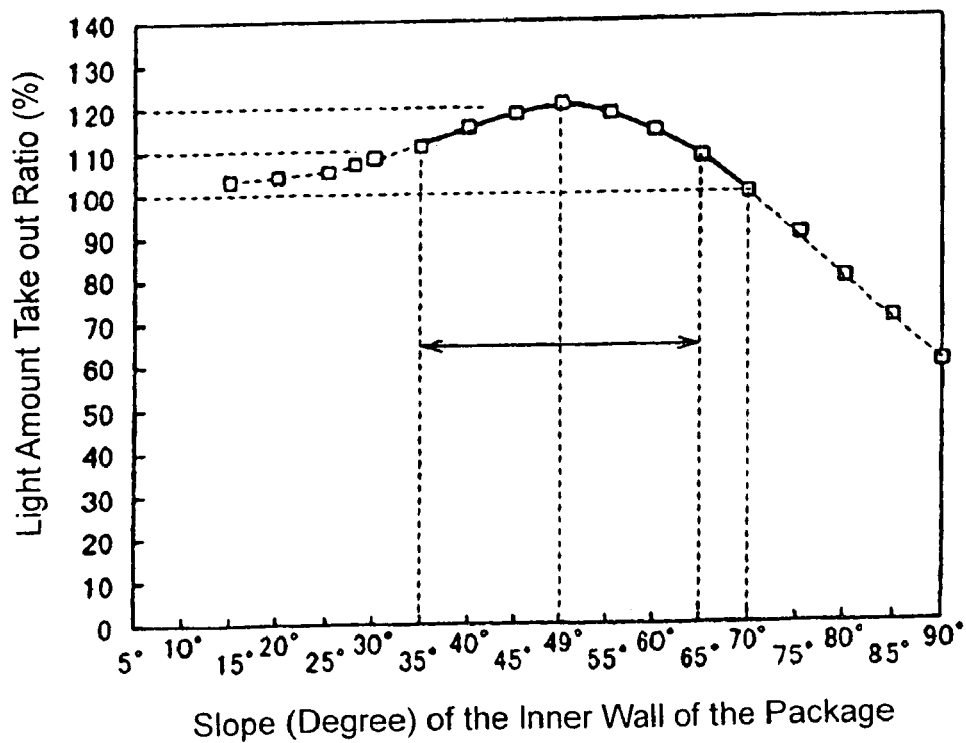
FIG. 7 is a graph showing a variation of take out rate of light amount capable of extracting from the interface when the angle between the inner wall face and the bottom face is changed in the package shown in FIG. 1.

FIG. 7 is a graph showing a transition of light amount take out ratio for various value of angle θ1 when epoxy resin is used as a translucent material. The abscissa indicates angle θ1 (°) between the inner wall face 7b and the bottom face 7a, the ordinate indicates amount of light take out ratio (%). The ordinate indicates a relative value in which light amount is taken as 100% when the angle θ1 of the inner wall face 7b is 70°. From the graph, it was confirmed that light amount take out ratio becomes maximum when the angle θ1 of the inner wall face 7b is matched with the incident critical angle 49°, the value is improved as high as 20% compared with the case when the angle θ1 of the inner wall face 7b is 70°. It was also confirmed that the light amount take out ratio is improved more than 10% when the angle θ1 of the inner wall face is in the range within ±15° of the incident critical angle 49°.

Figure 3:
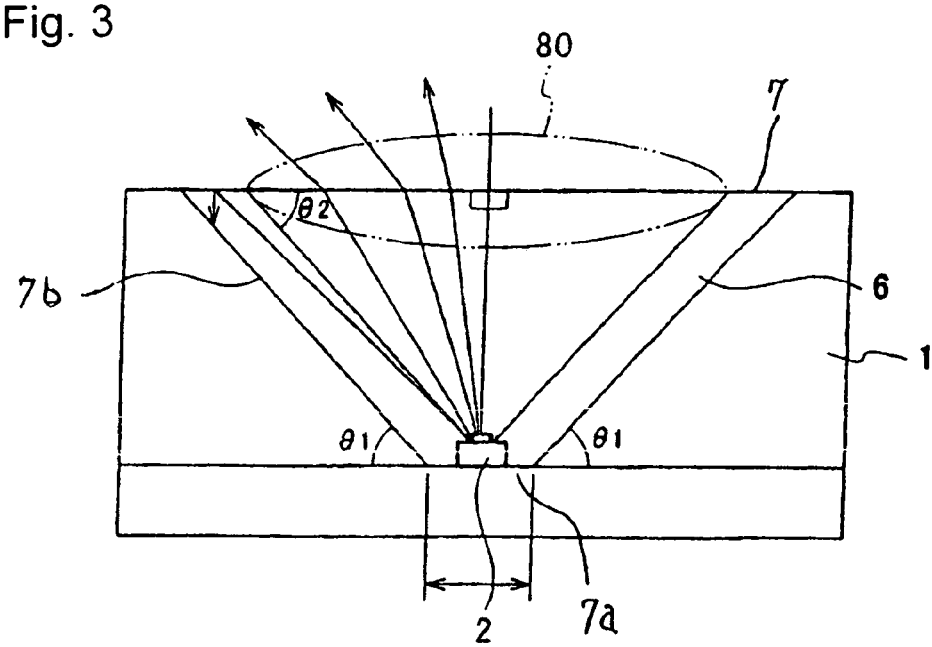
FIG. 3 is a figure for explaining the angle between the inner wall of the concave portion and the bottom face of the package shown in FIG. 1.

By the way, when the slope of the inner wall face 7b is decreased as mentioned above, exposed area electrode portion 3a, 4a of the lead frame at the bottom portion 7a of concave portion 7 is decreased as shown in FIG. 3. By this procedure, the advantage is that absorption amount of light by the electrode portion 3a, 4a is decreased, on the other hand, when LED is used as the light emitting element 2, a space for wire bonding should be secured on the surface of the electrode 4a for connecting the electrode of LED with the electrode portion 4a by a wire.

Therefore, in the present embodiment, a recess portion 8 is provided on a part of the inner wall face 7b by extended and formed along the radial direction to further expose the surrounding area of the electrode portion 4a of the lead frame 4, in order to secure an essential minimum space for wire bonding, as shown in FIG. 1 and FIG. 2. With this portion, another end of a wire 5 is connected with one end of which an upper electrode of the light emitting element 2 is connected.

Figure 8:
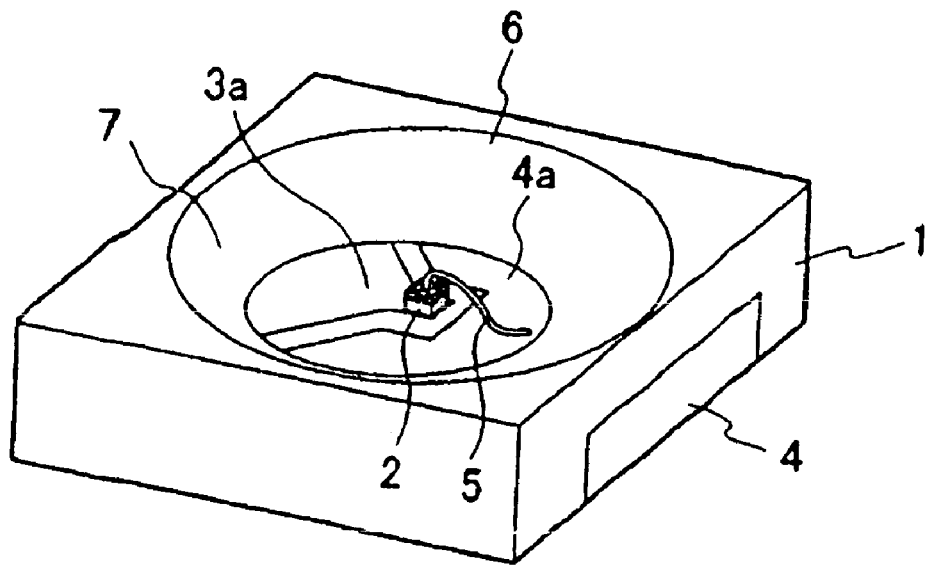
FIG. 8 is a perspective view showing a construction of a package which is a comparative sample of the package shown in FIG. 1.
Figure 9:
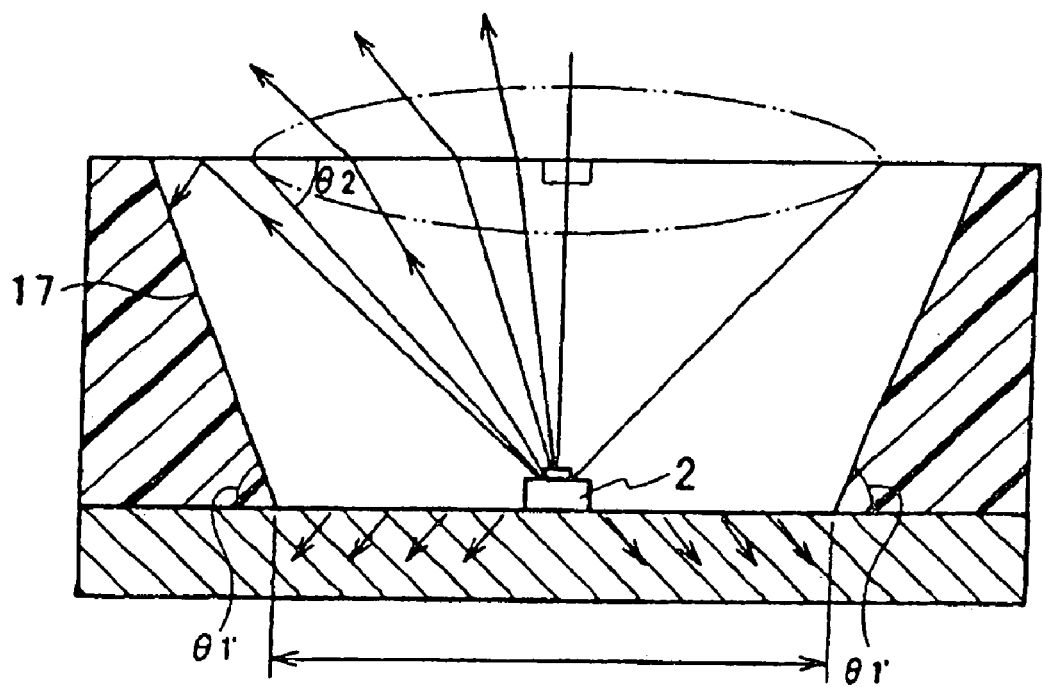
FIG. 9 is a figure for explaining routes of light radiated from the light emitting element in a package which is a comparative sample of the package shown in FIG. 1.

Next, a package of a comparative example will be explained using a perspective view of FIG. 8 and a cross section of FIG. 9. The package of the comparative example is so composed that the angle θ1 of the inner wall face 17 and the bottom face 7a is 70°. Because the slope between the inner wall face 17 and the bottom face 7a is high, the electrode portion 3a, 4a is widely exposed, so it is easy for wire bonding. On the other hand, as to the light reflected by the inner wall face 17, because a part of the radiation cone, the apex of which is the reflection position and the interface is the side face, intersects the inner wall face 17, whole the light inside the radiation cone cannot be taken outside. And, because the exposed area of the electrode portion 3a, 4a is large, the light absorption amount is large, so, the light amount can be taken outside the package becomes low. As to the other parts, the explanations are omitted because of the similar composition with the package of the present embodiment.

According to the present embodiment, by matching the angle θ1 of between the inner wall face 7b of the concave portion 7 and the bottom face 7a with the incident critical angle θ2 by which the direct light radiated from the light emitting element 2 undergoes total reflection at the interface between the translucent member 6 and air, the light from the light emitting element 2 can be radiated outside effectively. The reason is, as explained, because a radiation cone 81 having the apex at the reflection position of light at the inner wall face 7b and having the bottom face 7a at the interface, the angle between the side face and the bottom face 7a as incident critical angle θ2 is perfectly secured in the translucent member 6, all the light in the radiation cone 81 can be taken outside.

According to the present embodiment, by selecting the angle θ1 of the inner wall face 7b of the concave portion 7 and the bottom face 7a within the range of incident critical angle θ2 ±15°, substantially similar effect as the case θ1=θ2, can be obtained.

And, according to the present embodiment, by lowering the slope of the inner wall face 7b of the concave portion 7, exposed area of the electrode portion 3a, 4a of the lead frame is decreased, light absorption amount by the electrode portion 3a, 4a can be made low, the light emitted by the light emitting element 2 can be radiated outward effectively.

And, according to the present embodiment, by providing on a part of the inner wall face 7b of the concave portion 7 with a recess portion 8, a space for wire bonding the upper electrode of the light emitting element 2 with the electrode portion 4a even when the slope of the inner wall face 7b is made low.

Here, in the present embodiment, an epoxy resin is used as a translucent member 6, but it is not limited to epoxy resin. The incident critical angle θ2 by which total reflection begins at the interface between the translucent member 6 and air, varies according to the refractive index of the translucent member 6. When a translucent material other than epoxy resin is used or a plurality of translucent materials are mixed, an incident critical angle θ2 is obtained from refractive indices for each material, angle θ1 of the inner wall face 7b of the concave portion 7 and bottom face 7a.

Figure 10:
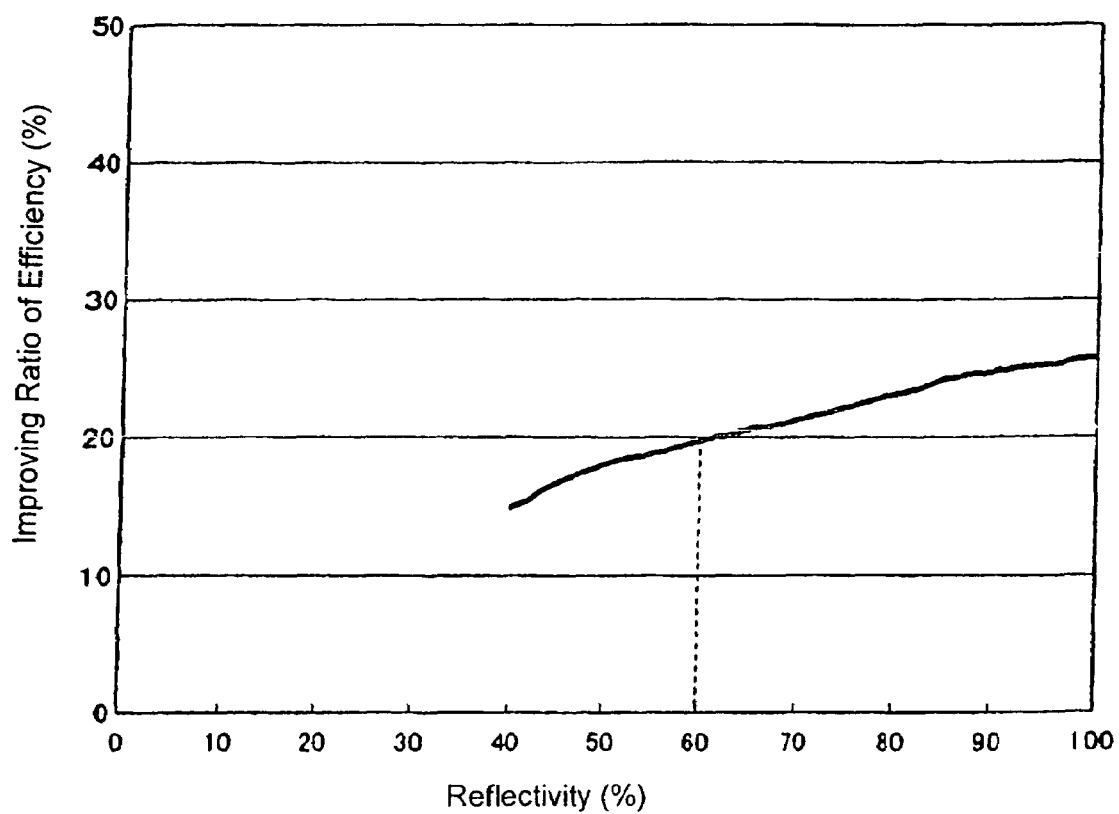
FIG. 10 is a graph showing the relation between a reflectivity of the inner wall face of the concave portion and improvement ratio of luminous efficiency in the package shown in FIG. 1.

FIG. 10 is a graph showing a relation between the reflectivity of the inner wall face 7b of the concave portion 7 and improving ratio of emission efficiency. The abscissa indicates reflectivity of the inner wall face 7b, the ordinate indicates the improving ratio of light take out efficiency at a package having angle 70° between the inner wall face 7b and the bottom face 7a when the angle is changed to 49°.

It is confirmed that the light take out efficiency is improved by 20% by making the reflectivity of the inner wall face 7b higher than 60%, as shown in the graph. Of course, the degree of the improvement of the light take out efficiency depends on the refractive index of the translucent member 6, when the refractive index is round 1.5, more than 20%, efficiency improvement can be assured.

As mentioned before, it is important how to take outside the light reflected by the inner wall face 7b of the concave portion 7, in radiating the light from light emitting element 2 effectively outside. In the present embodiment, the light is made capable of being radiated effectively outside, by making the reflectivity of the inner wall face 7b of the concave portion 7 as higher than 60%. And, because the basic composition of the package of the light emitting element in the present embodiment is similar with the one in the embodiment mentioned above, an overlapping explanation is omitted here.

Figure 11:
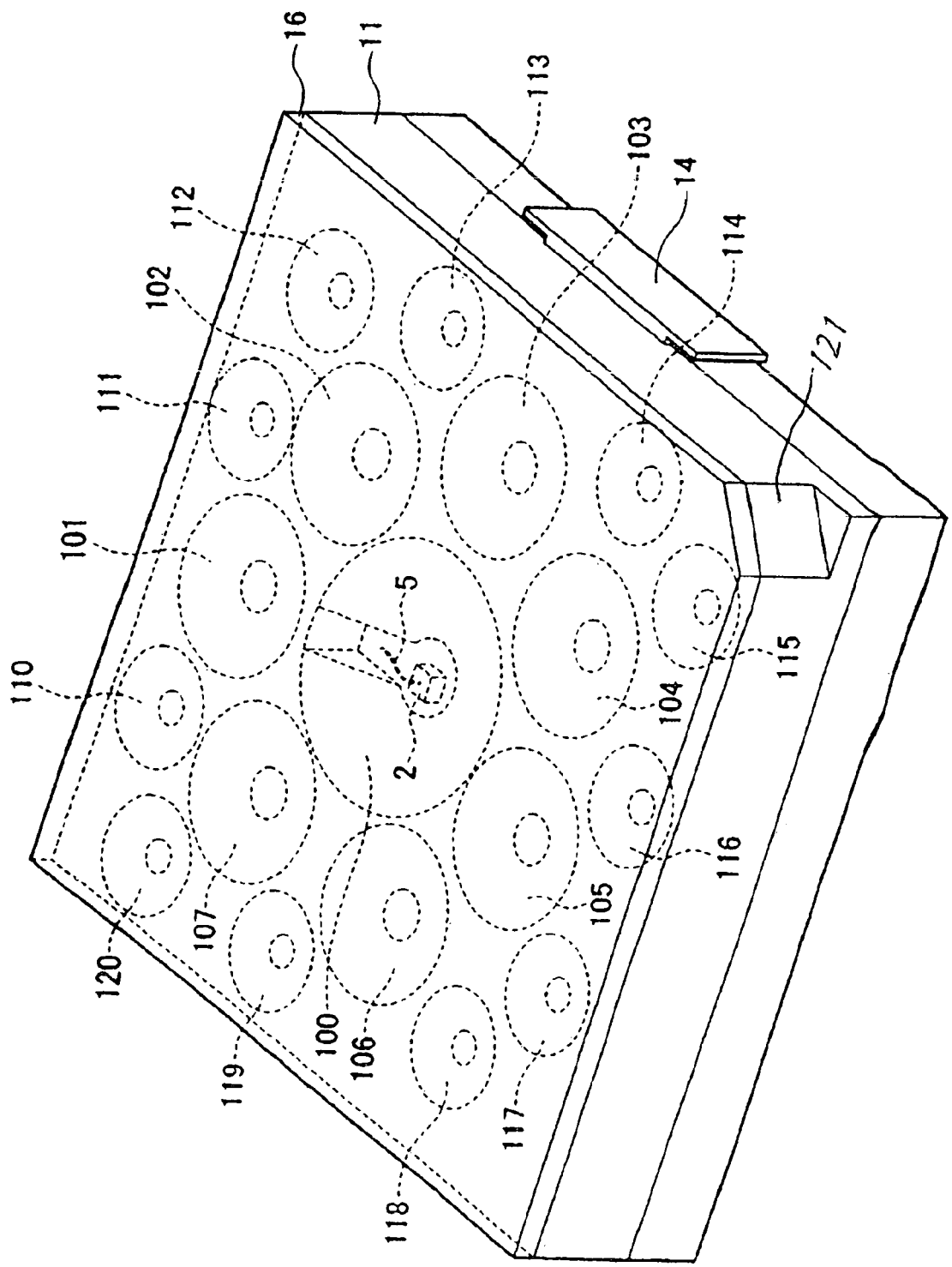
FIG. 11 is a perspective view showing a construction of a package of a light emitting element according to another embodiment of the present invention.
Figure 12:
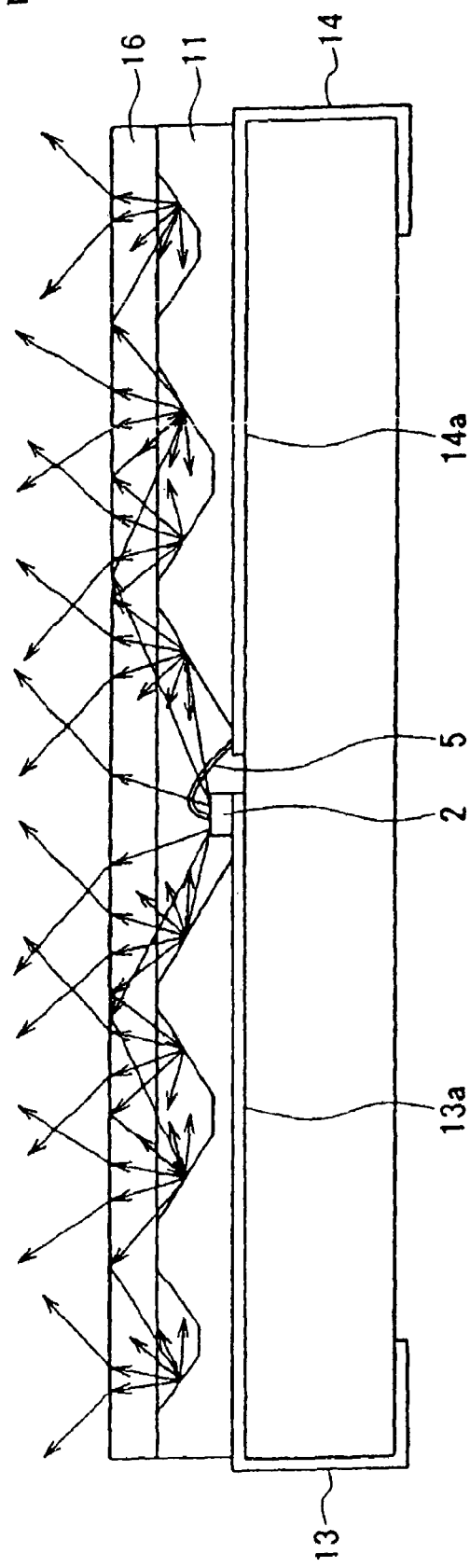
FIG. 12 is a cross section showing rout of reflected lights in the package shown in FIG. 11.

Next, FIG. 11 and FIG. 12 indicate a package for light emitting element according to the further different embodiment of the present invention. In this embodiment, a package capable of realizing a plane light source by a single light emitting element can be supplied. That is, the package of the light emitting element according to the present embodiment is provided with a central concave portion 100 on the center of the front face of the package main body 11 made of white PPA resin, on a bottom face 7a of the central concave portion 100 an electrode portion 13a of a first lead frame 13 made of metal and an electrode portion 14a of a second lead frame are arranged facing to each other. On the electrode portion 13a, under surface electrode of the light emitting element 2 is connected using electricity conducting material, upper surface electrode of the light emitting element 2 is connected with the electrode portion 14a of the second lead frame 14 through a wire 5.

The shape of the central concave portion 100 is similar with the concave portion 7 of the package in the embodiment shown in FIG. 1, the angle between the inner wall face of the concave portion 100 and the bottom face is selected as to agree with or within ±15° range of an incident critical angle by which the direct light radiated from the light emitting element 2 undergoes total reflection on the interface between the translucent member 16 and air.

The package main body 11 is provided with, around the central concave portion 100, at least one peripheral concave portion which has an angle between inner wall face and bottom face as similar with that in the concave portion 100 with no light emitting element 2 arranged on the bottom face.

The translucent member 16 is composed of, for example, epoxy resin, is formed to fill the central concave portion 100 and all peripheral concave portions 101 to 107, 111 to 120 to cover these in common and to make the upper face flat. When epoxy resin is used as translucent member 16, the reflective index becomes, for example, 1.5. As have been explained in the first embodiment, when the reflective index of the translucent material 16 is 1.5, amount of light take out ratio becomes maximum by coinciding the angle of the inner wall face of the central concave portion 100 with the incident critical angle 49°. Here, a notch portion 121 formed at the corner portion of the package main body 11 shown in FIG. 11 is a cathode mark showing the position of a cathode electrode of the light emitting element 2.

In the package constructed in this way, a part of the light emitted from the light emitting element 2 and reflected by the interface between the translucent member 16 and air, undergoes diffuse reflection by the reflection plane of the central concave portion 100 on which the light emitting element 2 is loaded, as shown by the cross section in FIG. 12. A part of the rest of the light reflected at the interface, and a part of the light which was after diffuse reflected at the reflection plane of the central concave portion 100 and reflected again at the interface, undergo diffuse reflection at the reflection plane of the peripheral concave portion 101 to 107, 111 to 120 arranged on the outer side of the central concave portion 100, a part of them goes outside from the interface. And, a part of light undergoes diffuse reflection at the reflection plane of further outer peripheral concave portion 101 to 107, 111 to 120, a part of it goes outside from the interface.

Therefore, in the present embodiment, by covering both the central concave portion 100 and the peripheral concave portion 101 to 107, 111 to 120 where no light emitting element is arranged with a common translucent member 16, the light reflected at the interface between the translucent member 16 and air and returns inside, undergoes diffuse reflection at the inner wall face of the peripheral concave portion 101 to 107, 111 to 120 and the bottom face. As the result, the light becomes easy to radiate outside, at the same time, a planar light source which by means of a thin package with a shallow formed concave portion enables the radiating light from the package having a planar broadening as a whole, can be realized. Because this planar light source can be realized not necessarily using a diffuse plate, the total thickness of the package can be made thin, a light source having a soft glitter and gentle for human eyes can be obtained. Because the package is thin, it is suitable for surface mounting on a print circuit board.

In the present embodiment, by selecting the angle between the inner wall face of the central concave portion and the peripheral concave portion 101 to 107, 111 to 120 and the bottom face to coincide with the incident critical angle by which the direct light radiated from the light emitting element 2 undergoes total reflection at the interface between the translucent member 16 and air, or within ±15° of the incident critical angle, the light from the light emitting element 2 can be radiated outside effectively.

Figure 13:
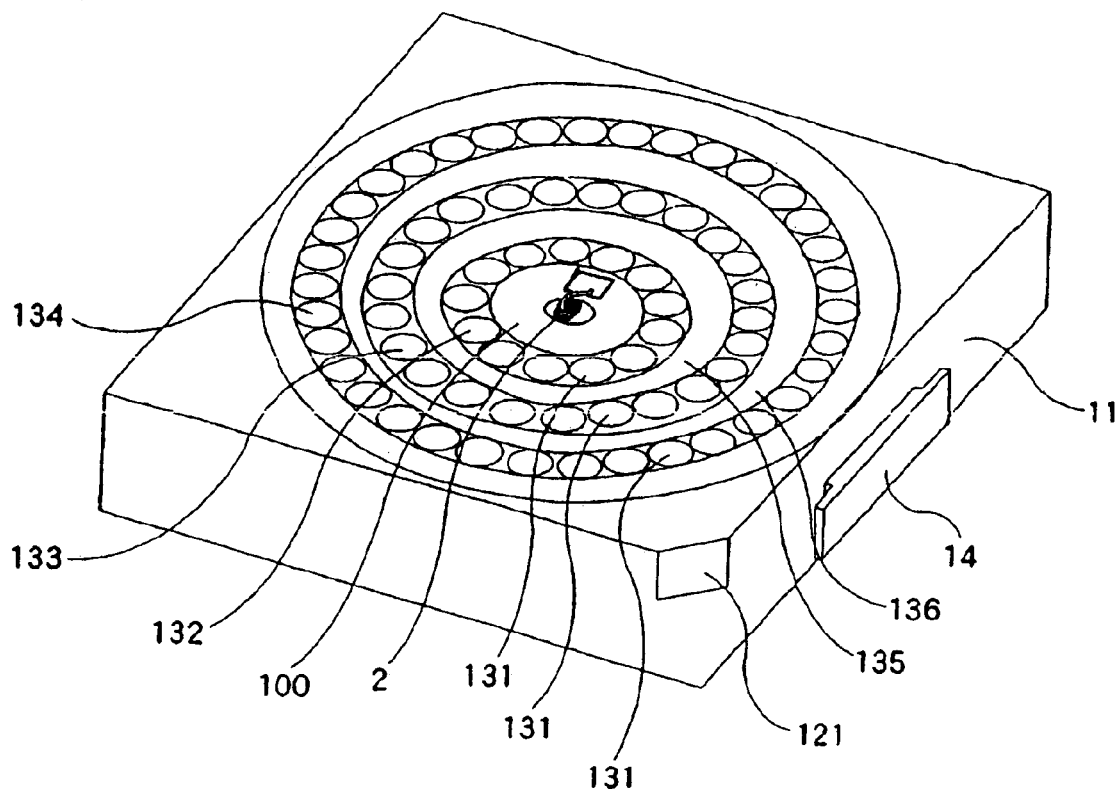
FIG. 13 is a perspective view showing a construction of a package of a light emitting element according to a further different embodiment of the present invention.
Figure 14:
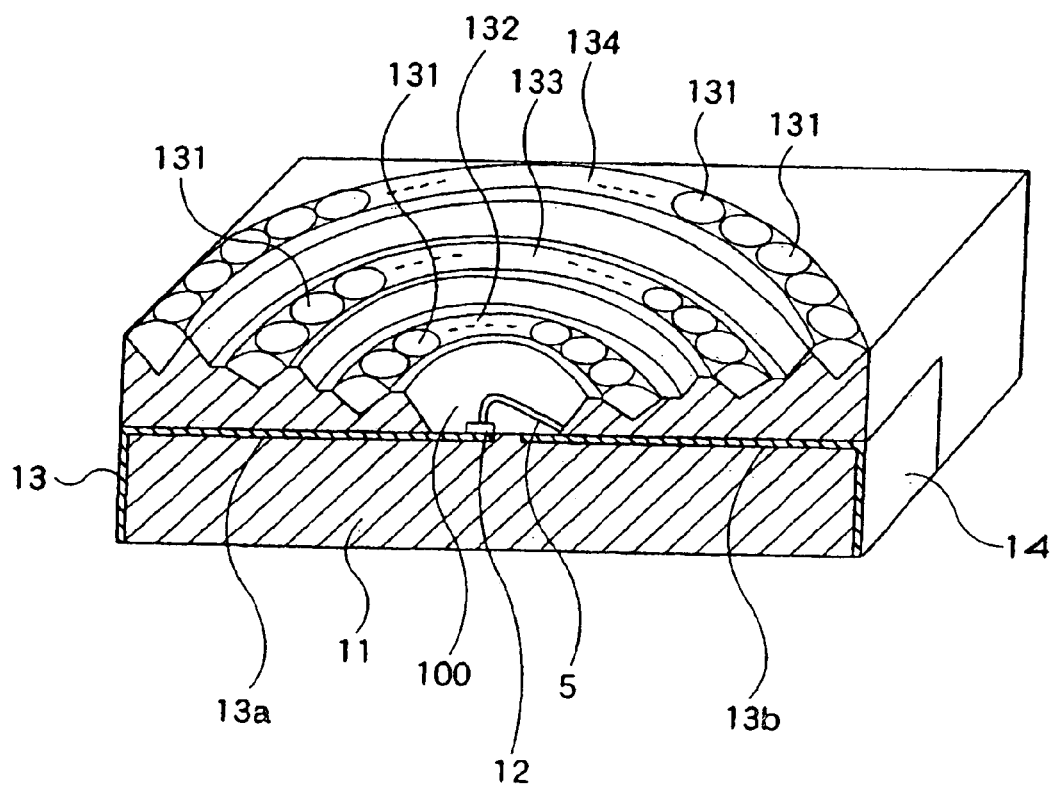
FIG. 14 is a perspective view showing a cross section of a part cut of the package of FIG. 13.

FIG. 13 and FIG. 14 show a package for light emitting element of a further different embodiment according to the present invention, FIG. 13 is a perspective view, FIG. 14 is cross section of a part shown by cutting along the radial direction at the center portion. Here, in the figure, parts corresponding to the components of the package shown in FIG. 11 and FIG. 12 are assigned with the same symbols and detailed explanations are omitted. In the package, a plurality of peripheral concave portions 131 formed on the upper face of the package main body 11 are arranged so as to form a plurality of concentric circles 132, 133, 134 around the central concave portion 100. Each of the plurality of the peripheral concave portions has nearly equal opening diameters and depths. And, because on the peripheral concave portion 131, light emitting elements are not located, the cross section is formed as an inverted cone shape as shown in FIG. 14. The peripheral concave portion 131 arranged on the different concentric circles 132, 133, 134 gradually raise the height as the position of their bottom portion (tip of inverted cone) is arranged from inner concentric circles to outer concentric circles. Between the different concentric circle 132 and 133, between concentric circle 133 and 134, concentric circular reflecting wall face 135, 136 are formed similarly around the central concave portion 100. These reflecting wall faces 135, 136 are formed as similar angles with the inner wall face of the central concave portion 100 to the bottom face of the central concave portion 100. That is, the angle between each reflecting wall face 135, 136 and the bottom face of the concave portion 100 is selected as to coincide with the incident critical angle which the direct light radiated from the light emitting element 2 undergoes at the interface between the translucent member 16 and air (will be mentioned later) or within ±15° range of the incident critical angle.

The upper surface of the package main body 11 on which a plurality of peripheral concave portions 131 are formed around the central concave portion 100 in this way, is covered with a translucent member 16, for example, composed of epoxy resin. That is, the translucent member 16 is formed in such a way that epoxy resin fills to cover whole of the central concave portion 100, whole peripheral concave portion 131 and concentric circular reflective wall surface 135, 136 in common, and to make the upper surface flat.

Figure 15:
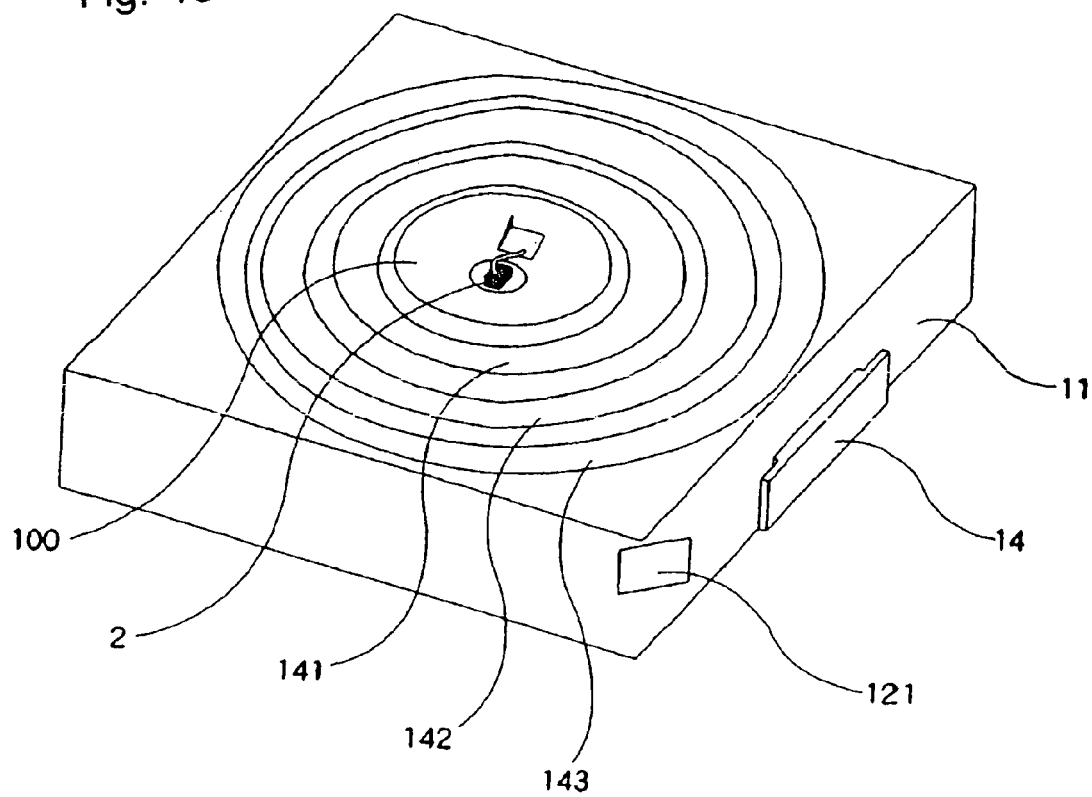
FIG. 15 is a perspective view showing a construction of a package of a light emitting element which is a further different embodiment of the present invention.
Figure 16:
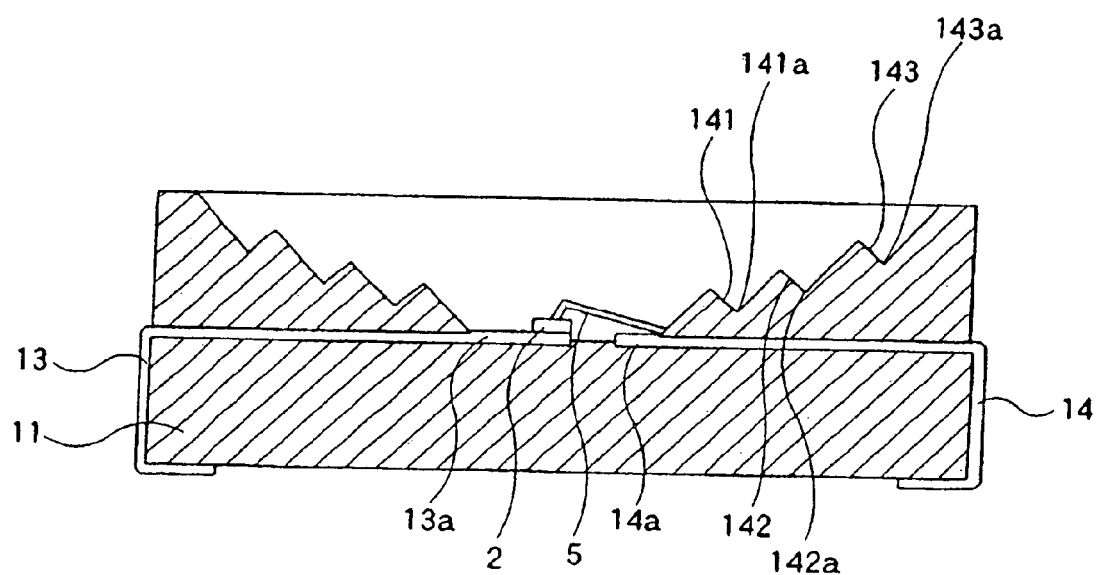
FIG. 16 is a cross section of the package shown in FIG. 15.

FIG. 15 and FIG. 16 show a package for light emitting element indicating further different embodiment of the present invention, FIG. 15 is the perspective view, FIG. 16 is the cross section. Here, in the figures, parts corresponding to the component parts of the package shown in FIG. 11 and FIG. 12 are assigned with the same symbols and the detailed explanations are omitted. The package is provided with a plurality of concentric circular reflecting grooves 141, 142, 143 around the central concave portion 100 formed on the upper face of the package main body 11. Each of these reflecting grooves 141, 142, 143 has "V" shaped cross section, their bottom portions 141a, 142a, 143a (not illustrated) have gradually raised position as the concentric circle becomes outer side one, as shown in FIG. 16. Therefore, the "V" shaped reflecting wall surface each composing the reflecting grooves 141, 142, 143 is produced in such a way that the height of the outer side reflecting wall surface is higher than that of the reflecting wall surface of the center side one of the concentric circles.

The invention claimed is:

1. A package for a light emitting element comprising:
a package main body having a bottom face on which a light emitting element is arranged and a concave portion formed in an inverted truncated cone shape on an inner wall face intersecting with the bottom face by a predetermined angle; and
a translucent member provided in the concave portion of the package main body,
wherein the inner wall face provides diffuse reflection, and
wherein the angle between the inner wall face composing the concave portion and the bottom face is selected within ±15° of the incident critical angle in which a direct light radiated from the light emitting element undergoes total reflection at the interface between the translucent member and air.

2. A package for a light emitting element according to claim 1, wherein the package main body is composed of resin or ceramic.

3. A package for a light emitting element according to claim 2, wherein each of the resin or the ceramic is composed of white resin or white ceramic respectively.

4. A package for a light emitting element according to claim 3, wherein the white resin is composed of polyphthalamide resin or silicone resin.

5. A package for a light emitting element according to claim 1, wherein the reflectivity of the inner wall face of the concave portion is 60% or higher.

6. A package for a light emitting element according to claim 1, further comprising:
on the bottom portion of the concave portion of the package main body, a lead frame mounting the light emitting element thereon is buried, a part of the lead frame is exposed by a recess portion formed on the bottom face of the concave portion and on the inner wall face.

7. A package for a light emitting element according to claim 6, wherein the package main body is composed of resin or ceramic.

8. A package for a light emitting element according to claim 7, wherein each of the resin or the ceramic is composed of white resin or white ceramic respectively.

9. A package for a light emitting element according to claim 8, wherein the white resin is composed of polyphthalamide resin or silicone resin.

10. A package for a light emitting element according to claim 9, wherein the reflectivity of the inner wall face of the concave portion is 60% or higher.

11. A package for a light emitting element comprising:
a package main body where a plurality of peripheral concave portions are formed around a central concave portion in which a light emitting element is arranged on the bottom portion; and
a translucent member provided in the central concave portion and the plurality of peripheral concave portions in common,
the central concave portion being composed of a bottom face on which the light emitting element is arranged, and an inner wall face intersecting with the bottom face with a predetermined angle in an inverted truncated cone shape,
wherein the inner wall face provides diffuse reflection, and
wherein the angle between the inner wall face and the bottom face is selected within ±15° of the incident critical angle in which a direct light radiated from the light emitting element undergoes total reflection at the interface between the translucent member and air, the angle between the inner wall face of the plurality of peripheral concave portions and the bottom face is set nearly equal to the corresponding angle of the central concave portion.

12. A package for a light emitting element according to claim 11, further comprising:
in the plurality of peripheral concave portions, the peripheral concave portions located at positions farther from the central concave portion are built to make the position of the bottom portion higher compared with the peripheral concave portions located at a nearer position.

13. A package for a light emitting element according to claim 12, wherein the plurality of peripheral concave portions have nearly equal opening diameters and depths, and cross sections formed in nearly inverted cone shape, the bottom portion of the peripheral concave portion arranged on the outer concentric circles are located in a higher position than those arranged on inner concentric circles.

14. A package for a light emitting element according to claim 13, wherein the package main body is composed of resin or ceramic.

15. A package for a light emitting element according to claim 14, wherein each of the resin or the ceramic is composed of white resin or white ceramic respectively.

16. A package for a light emitting element according to claim 15, wherein the white resin is composed of polyphthalamide resin or silicone resin.

17. A package for a light emitting element according to claim 11, wherein the plurality of peripheral concave portions are arranged to form a plurality of concentric circles around the central concave portions.

18. A package for a light emitting element comprising:
a package main body on which a plurality of concentric circular reflecting grooves are formed around a central concave portion a light emitting element is arranged on bottom portion thereof; and a translucent member provided in the central concave portion and a plurality of reflecting grooves which are formed on the package main body in common; the central concave portion is formed in an inverted truncated cone shape by a bottom face on which the light emitting element is arranged, and an inner wall face intersecting with the bottom face with a predetermined angle, the angle between the inner wall face and the bottom face is selected within ±15° of the incident critical angle in which a direct light radiated from the light emitting element undergoes total reflection at the interface between the translucent member and air, the angles between plurality of inner wall face and the bottom face of the peripheral concave portions are nearly equal to the corresponding angles of the central concave portions.

19. A package for a light emitting element according to claim 18, wherein the package main body is composed of resin or ceramic.

20. A package for a light emitting element according to claim 19, wherein each of the resin or the ceramic is composed of white resin or white ceramic respectively.

21. A package for a light emitting element according to claim 20, wherein the white resin is composed of polyphthalamide resin or silicone resin.

22. A manufacturing method of a package of a light emitting element comprising:

preparing a package main body composed of a bottom face on which the light emitting element is arranged and a concave portion which is formed in an inverted truncated cone shape on an inner wall face intersecting with the bottom face with a predetermined angle;

preparing a translucent member filled in the concave portion;

processing the inner wall face so as to provide diffuse reflection; and selecting the angle between the inner wall face composing the concave portion and the bottom face to be within ±15° of the incident critical angle in which a direct light radiated from the light emitting element undergoes total reflection at the interface between the translucent member and air.

* * * * *